United States Patent [19]
Kitazawa et al.

[11] Patent Number: 5,031,148
[45] Date of Patent: Jul. 9, 1991

[54] MOS SEMICONDUCTOR MEMORY DEVICE
[75] Inventors: Shooji Kitazawa; Teruhiro Harada, both of Tokyo, Japan
[73] Assignee: Oki Electric Industry Co., Ltd., Japan
[21] Appl. No.: 382,541
[22] Filed: Jul. 19, 1989
[30] Foreign Application Priority Data Jul. 22, 1988 [JP] Japan .................................. 63-183324

[51] Int. Cl.$^5$ .............................................. G11C 7/00
[52] U.S. Cl. ................................ 365/189.09; 365/185; 365/203
[58] Field of Search ................... 365/230.03, 226, 203, 365/185, 189.07, 189.09, 189.11

[56] References Cited
U.S. PATENT DOCUMENTS 4,387,447  6/1983  Klaas et al. .......................... 365/203
4,709,352 11/1987  Kitazawa ............................. 365/104
4,722,075  1/1988  Kaszubinski ........................ 365/226

FOREIGN PATENT DOCUMENTS 0254750  2/1988  European Pat. Off. .

OTHER PUBLICATIONS

1988 IEEE International Solid-State Circuits Conference, "Session X: Nonvolatile Memories, THAM 10.1: A 90ns 4Mb CMOS EPROM," by Canepa et al, Feb. 18, 1988, pp. 120-121.
M. Fukuda et al., "A 55ns 64Kx16b CMOS EPROM", 1988 IEEE International Solid-State Circuits Conference, Digest of Technical Papers, pp. 122-123.

Primary Examiner—Joseph A. Popek
Attorney, Agent, or Firm—Edward D. Manzo

[57] ABSTRACT

In a memory MOS semiconductor memory device comprising a memory matrix having semiconductor memory elements arranged in rows and columns, the memory elements in the same rows being connected to the respective word lines, and the memory elements in the same columns being connected to the respective source lines and data lines. A row decoder outputs a row selection signal to one of the rows of the memory elements through the word lines, while a column decoder outputs a column selection signal to one of the columns through the source lines. A common data line is electrically coupled to a plurality of the data lines, a constant voltage is applied from a common circuit to the data lines through the common data line, and the current required for maintaining the common data line at a constant voltage is detected by a detecting circuit.

21 Claims, 5 Drawing Sheets

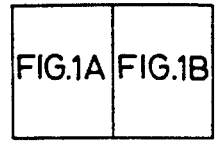
FIG.1A
MOS SEMICONDUCTOR MEMORY DEVICE OF THE INVENTION
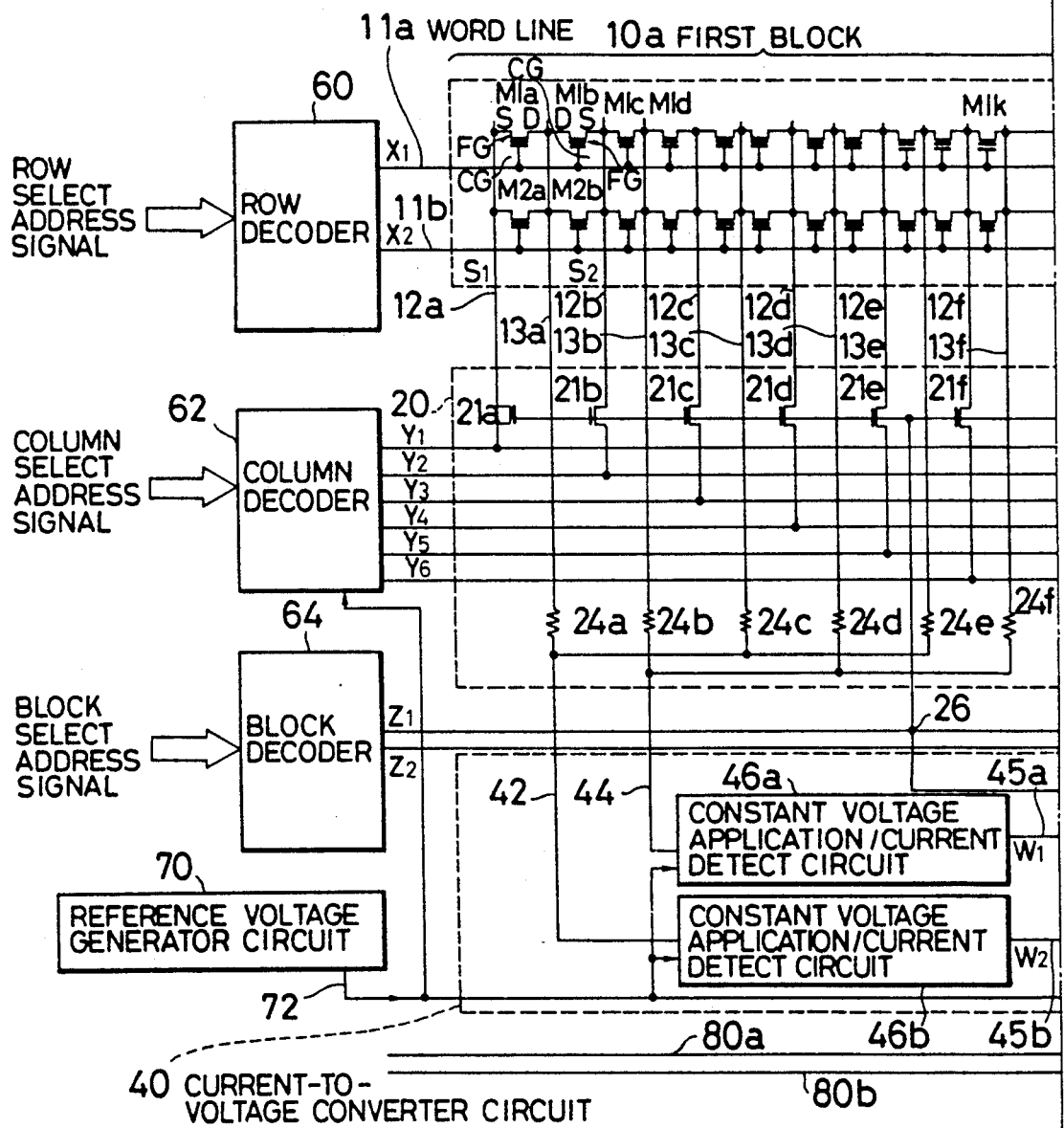

MOS SEMICONDUCTOR MEMORY DEVICE OF THE INVENTION

CONSTANT VOLTAGE APPLICATION / CURRENT DETECT CIRCUIT

SIGNAL OUTPUT CIRCUIT OF COLUMN DECODER

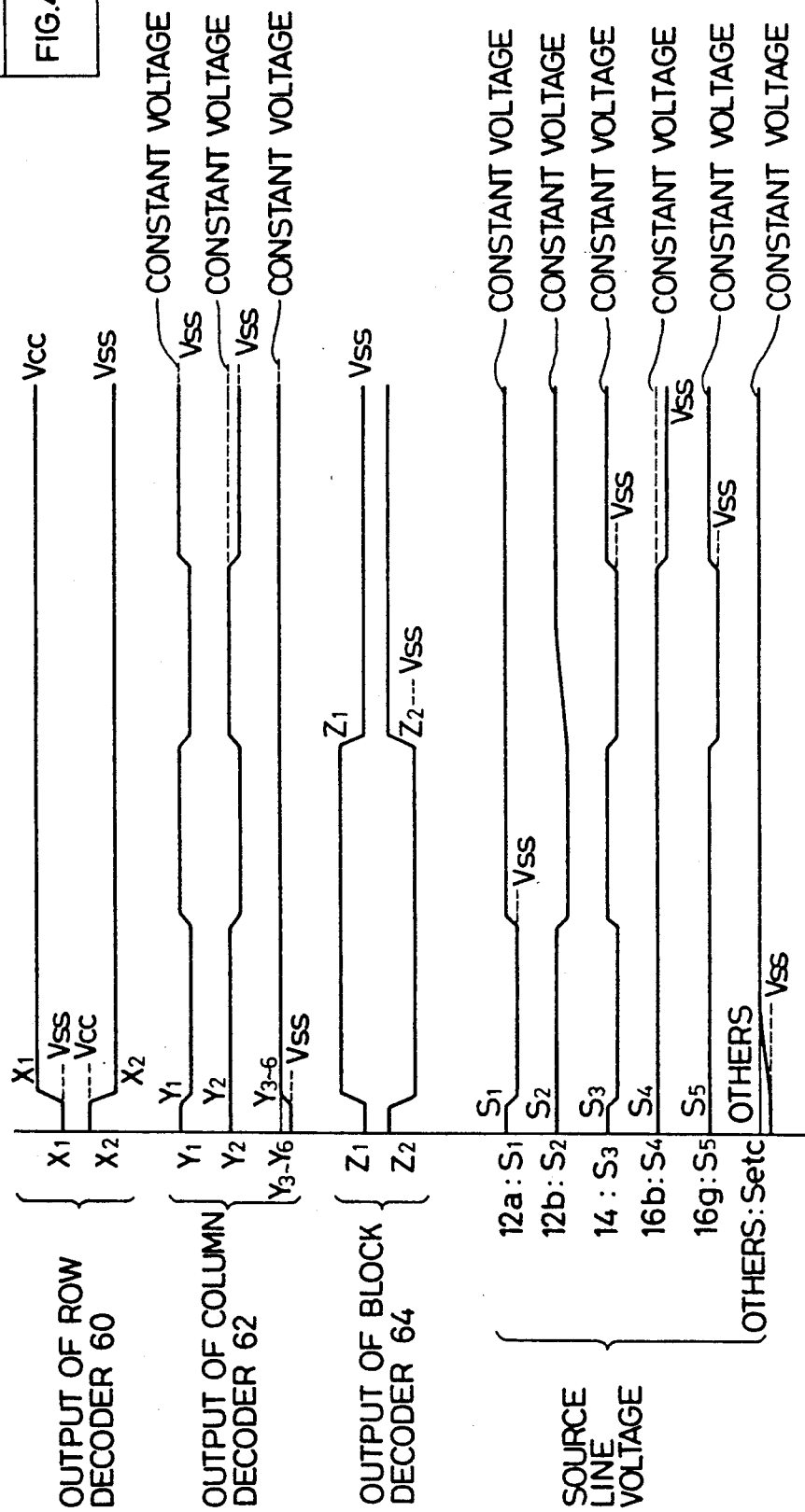

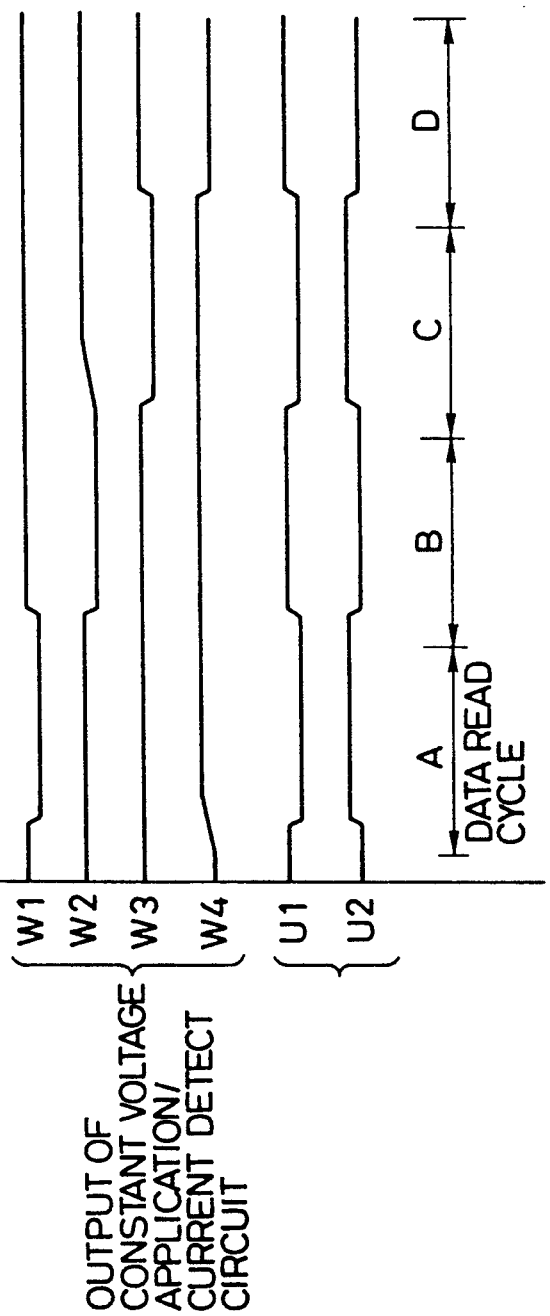

MOS SEMICONDUCTOR MEMORY DEVICE

BACKGROUND OF THE INVENTION

The present invention relates to a MOS semiconductor memory device, and particularly to a data read circuit therefor.

An asynchronous EPROM (electrically programmable read-only memory) having silicon gates known in the art is a NOR-type memory cell array shown for example in ISSCC 88 (1988 IEEE International Solid-state Circuits Conference) Session X, THAM 10.1 and THAM 10.2.

A circuit for assisting a memory cell array of the X-cell scheme (shared-contact configuration) which has X-cell configuration, different from the NOR-type configuration, and which can reduce the area for the memory cell array is shown for example in U.S. Pat. No. 4,387,447. The memory cell array of the X-cell scheme has the possibility of the size reduction of the memory cell array itself, and promises its utilization.

However, in the case of the X-cell scheme, circuits necessary for writing and reading data into and from the memory cell array are larger and more complicated than in the case of the NOR-type memory, and the area for the overall circuitry is larger, and the designing of the device is time-consuming. That is, in the case of the conventional X-cell scheme, shown for example in U.S. Pat. No. 4,722,075, the source lines and the data lines are disposed alternately in the column direction, and charging transistors for setting the source lines under a constant-bias condition when the memory cells are not selected, and switching transistors for lowering the potential on the source lines when the memory cells are selected, must be separately provided for the respective source lines. In the case of the NOR-type, only one MOS transistor is needed for each data line for selectively connecting the data lines to a common data line. Accordingly, the area for the circuits required is larger in the X-cell scheme than in the NOR-type.

Moreover, in the case of the conventional X-cell scheme, a bias circuit for setting the data line under the constant bias condition when the memory cells are not selected is formed of a circuit separate from the generator circuit for generating the data detect voltage provided for the sense amplifier. But because of the manufacturing variation in the characteristics of the transistors forming the integrated circuit, differences are created between the voltage on the data line due to the bias circuit and the voltage on the data line due to the sense amplifier, and it was necessary to allow the voltage on the data line selected during the data reading to change from the voltage due to the bias circuit to the data detect voltage. The time for reading data in the integrated circuit is therefore lengthened. Moreover, because of the manufacturing variation in the characteristics of the transistors forming the bias circuit for the data lines, the voltages on the source lines are not uniform and the time for reading data lines may not be uniform.

A further problem common to the conventional memories of the X-cell scheme and NOR-type is that the high voltage amplitude required of the data lines delays the data reading. That is, for example the voltage on the data line must be lower than the common data line in order to convey the current that flows through the memory element, from the data line to the common data line via a MOS transistor that connects the data line and the common data line. The data line must therefore be supplied with a signal having a voltage amplitude dependent on the source-drain resistance of the MOS transistor to achieve data reading. In the case of an ordinary EPROM, the source-drain resistance of the MOS transistor is on the order of 1 K$\Omega$, and the current amplitude dependent on the data on the memory element is 0 to 60 $\mu$A, so a voltage having an amplitude of about 60 mV must be applied to the data line regardless of the performance of the sense amplifier. The necessity of the high voltage amplitude on the data line led to delay in the data reading from the integrated circuit.

SUMMARY OF THE INVENTION

The present invention has been accomplished to solve the above problems of the prior art, and its object is to provide a MOS semiconductor memory device in which the read circuit for a memory matrix is simple and which is capable of high-speed data reading.

The MOS semiconductor memory device according to the present invention includes a memory matrix having semiconductor memory elements arranged in rows and columns. Word lines are coupled to the memory elements along the rows. A row decoder outputs a row selection signal to a selected row of the matrix through a selected word line.

The memory includes a plurality of source lines connected to memory elements along the columns. A column decoder outputs a column selection signal to a selected column via the corresponding source line. Additionally in the column direction, a plurality of data lines also are connected to the memory elements. A common data line is also coupled electrically to a plurality of the data lines. A group of such common data lines may be provided.

Also included is a constant voltage applying circuit which a constant voltage through the common data line to its corresponding plurality of data lines. Further included is a current detection circuit which detects the current required for maintaining the common data line at a common voltage. The current detecting circuit and the constant voltage applying circuit may be combined in a preferred embodiment. Further, a group plurality of such combined circuits may be provided to correspond in number with the number of common data lines.

In a specific embodiment of this invention, a reference voltage generator circuit is coupled to the constant voltage applying circuit. The reference voltage generated by this generator is used in these circuits to provide a constant voltage to the data lines.

In the present invention, the row select signal from the row decoder is used to select one of the rows of the plurality of the word lines, and the column select signal from the column decoder is used to select one of the columns of the plurality of source lines, thereby to select one of the semiconductor memory elements in the memory matrix. The data line connected to the selected semiconductor memory element is supplied with the constant voltage from the constant voltage applying circuit connected through the common data line, and the current detect circuit detects the current flowing from the data line through the selected semiconductor memory element to the source line to maintain the constant voltage. The data of the semiconductor memory element can be read from the magnitude of the current detected by the current detect circuit.

In addition, switch means can be provided for the plurality of source lines, and the operation of the switch means can be controlled by the block decoder thereby to select a block in a device in which the memory matrix consists of a plurality of blocks.

By further provision of a constant voltage generating circuit, the voltage applied from the column decoder to the source line and the voltage applied from the constant voltage generating circuit to the data line are both generated on the basis of the voltage output from the constant voltage generating circuit, so that it is possible to equalize the voltages on the source line and the data line when the semiconductor memory element is not selected (where the constant voltage applying circuit is not common, the voltages on the source line and the data line are not uniform for instance because of the variations in the characteristics of the constant voltage generating transistors). Accordingly, it is possible to prevent flow of an electric current between the source line and the data line via unselected memory elements, and correct reading of the data is ensured.

BRIEF DESCRIPTION OF THE DRAWINGS

FIG. 4 is formed by two portions labeled as FIG. 4A and FIG. 4B which together constitute a signal waveform diagram showing the operation of the present embodiment.

DETAILED DESCRIPTION OF THE EMBODIMENTS

An embodiment of the invention will now be described with reference to the drawings.

Figure 1B:
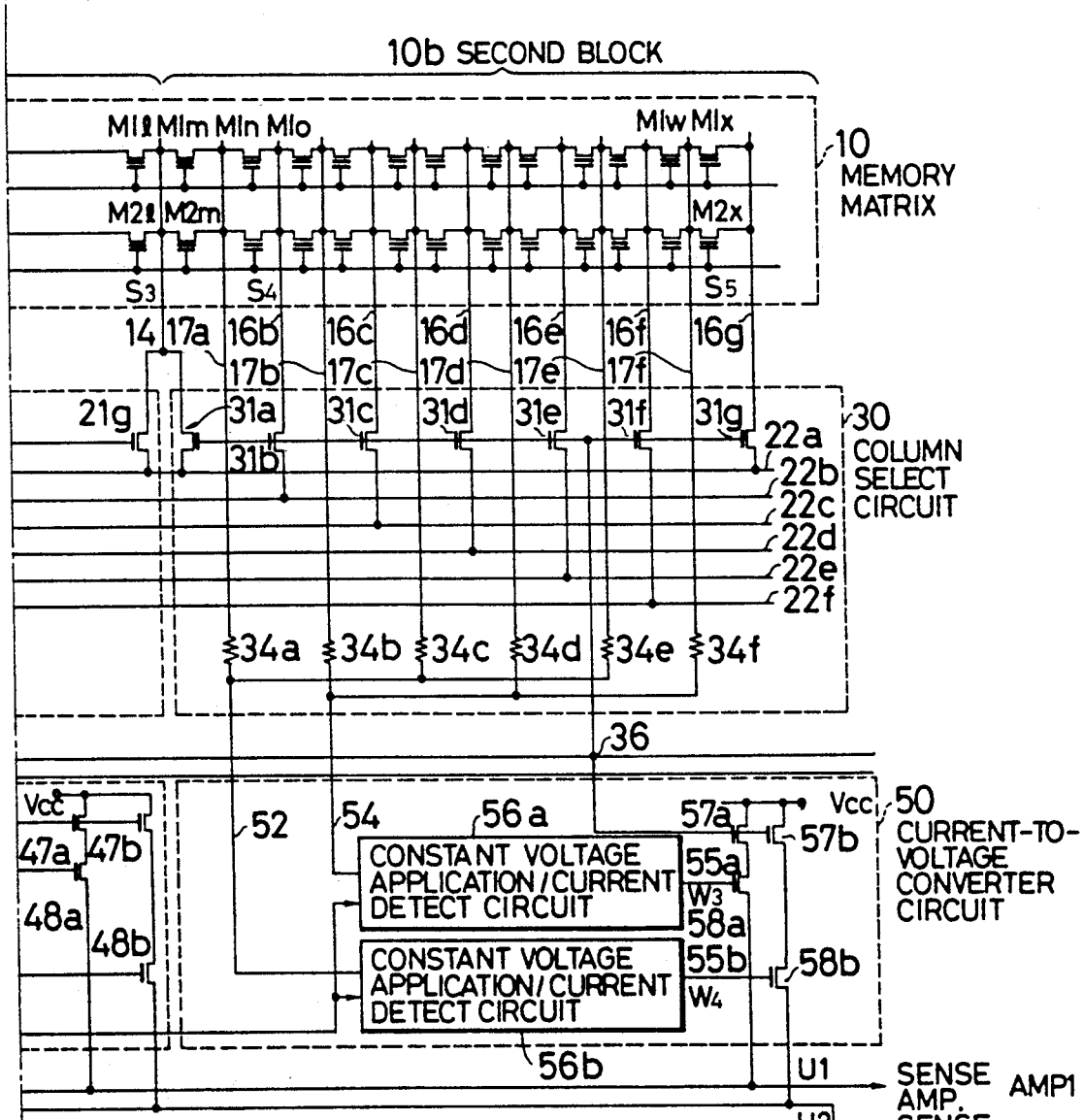
FIG. 1 is formed by two portions labeled as FIG. 1A and FIG. 1B. Together, they show a circuit diagram showing an embodiment of one MOS semiconductor memory device according to the invention.

FIG. 1 is a circuit diagram showing an embodiment of the MOS semiconductor memory device according to and invention. The illustrated circuit is a data read circuit for an EPROM.

In the figure, 10 is a memory matrix of 2 rows by 24 columns. The memory matrix 10 comprises memory elements M1a to M1x, and M2a to M2x having a floating gate, word lines 11a and 11b, source lines 12a to 12f, 14, and 16b to 16g, and data lines 13a to 13f, and 17a to 17f.

The memory elements M1a to M1x, and M2a to M2x each have a source S, a drain D, a floating gate FG and control gate CG (in the figure, the reference marks S, D, FG and CG are given to the memory elements M1a and M1b, only). As regards the memory element M1a, the source S is connected to the source line 12a, the drain D is connected to the data line 13a, and the control gate CG is connected to the word line 11a. As regards the memory element M1b, the source S is connected to the source line 12b, the drain D is connected to the data line 13a, and the control gate CG is connected to the word line 11a. The connection of other memory elements M1c to M1x, M2a to M2x is similar. In this type (shared-contract type), adjacent memory elements share a source line and a data line. When a single word line and a single source line are selected, two memory elements adjacent to each other are selected, and the data is sent to a pair of data lines adjacent to and on both sides of the selected source line. The value of the data in the memory element is determined from whether or not excessive electrons are present in the floating gate of the memory elements M1a to M1x, and M2a to M2x.

During the actual data reading of data from the memory elements, the control gate voltage is set at Vcc (5 V), the source voltage is set at Vss (0 V), and the drain is given a positive potential of about 1.2 V. If no excessive electrons are present in the floating gate, a current of about 60 μA flows through the drain-source circuit. If excessive electrons are present in the floating gate, a current of not more than 20 μA flows through the drain-source circuit. On the basis of this current, data can be read. The positive potential (about 1.2 V) given to the drain is set to be sufficiently lower than 3.2 V, which corresponds to the energy level difference between the silicon conduction band and the oxide conduction band, so as not to cause injection of electrons into the floating gate during data reading. The voltage given to the word line is Vss when unselected, and is Vcc when selected.

In FIG. 1, the memory matrix 10 consists of a first and a second blocks 10a and 10b. The first block 10a comprises the data lines 13a to 13f, the source lines 12a to 12f and 14, and the memory elements M1a to M1l and M2a to M2l having their drains connected to the data lines 13a to 13f and their sources connected to the source lines 12a to 12f, and 14. The second block 10b comprises the data lines 17a to 17f, the source lines 14, and 16b to 16g, and the memory elements M1m to M1x and M2m to M2x having their drains connected to the data lines 17a to 17f and their sources connected to the source lines 14 and 16b to 16g.

Either of the blocks is selected, and data in a memory element in the selected block is read. The data line is fixed at a voltage (hereinafter referred to as constant voltage) which is usually about 1.2 V and is determined. The source line in the selected block is fixed at the constant voltage when unselected, and set at Vss when selected. The source line in the unselected block is set at an arbitrary voltage between the voltage Vss and the constant voltage.

A column select circuit 20 for the first block 10a of the memory matrix 10. The column select circuit 20 comprises the source lines 12a to 12f and 14, wirings (wiring condutors) 22a to 22f disposed to extend in the direction of the rows in the memory matrix 10 and conveying the column select signals to the source lines 12a to 12f and 14, and NMOS transistors (switch means) 21a to 21g serially connected to the source lines 12a to 12f, and 14. The gates of the NMOS transistors (switch means) 21a to 21g are all connected together to a node 26. When a voltage Vss as a column select voltage is applied to the node 26, the NMOS transistors 21a to 21g are turned off and the source lines 12a to 12f are electrically disconnected from the wirings 22a to 22f.

The column select circuit 20 further comprises a common data line 42 connected to the data lines 13a, 13c and 13e via resistors 24a, 24c, and 24e, and another common data line 44 connected to the data lines 13b, 13d and 13f via resistors 24b, 24d, and 24f.

A column select circuit for the second block 10b of the memory matrix 10 comprises the source lines 14, and 16b to 16g, wirings 22a to 22f, and NMOS transistors 31a to 31g. The gates of the NMOS transistors 31a to 31g are all connected together to a node 36.

The column select circuit 30 further comprises a common data line 52 connected to the data lines 17a, 17c and 17e via resistors 34a, 34c, and 34e, and another common data line 54 connected to the data lines 17b, 17d and 17f via resistors 34b, 34d, and 34f. When the second block 10b is selected the operation is similar to that when the first block 10a is selected. The data are output onto the two common data lines 52 and 54. The left and right ends of the blocks are the source lines 12a and 16g, and the source line 14 at the boundary of the blocks are shared by the first and the second blocks 10a and 10b.

The resistors (electrical resistors) 24a to 24f and 34a to 34f are formed of resistive materials such as polysilicon or impurity-diffused layer, or MOS transistors having their gate potential fixed. Their resistance values can be varied depending on the application of the integrated circuit, and are 0 Ω where a specially high speed data access is required, to provide a structure in which the data lines and the common lines are short-circuited.

Circuit 40 is a current-to-voltage converter circuit (current detect means) for converting a current flowing through the data line into a voltage. The current-to-voltage converter circuit 40 comprises constant voltage application/current detect circuits 46a and 46b, switching NMOS transistors 47a and 47b, and voltage transmission NMOS transistor 48a and 48b. The current-to-voltage converter circuit 40 converts the currents to voltages to detect the current values, and also functions as a constant voltage application circuit (constant voltage application means) for applying a constant voltage to the common data lines 42 and 44. That is, when the first block 10a is selected, the current-to-voltage converter circuit 40 applies a voltage to the set selected data lines at the constant voltage, and detects the currents which flows to the source lines selected via memory elements from the data lines (the then selected source lines being set at Vss) and converts the current values to voltage values and transmits them to the second common data lines 80a and 80b.

The internal functions of the current-to-voltage converter circuit 40 will now be described. The constant voltage application/current detect circuits 46a and 46b receive a constant voltage from a reference voltage generator circuit 70 and act, via the common data lines 42 and 44, on the data lines for the memory elements so that they are maintained at the constant voltage. They also supply current values equal to the values of the currents which flow through the selected memory elements from the data lines to the source lines, and convert the current values to the voltage values to output at the output terminals 45a and 45b. The NMOS transistors 47a, 48a, and 47b, 48b are serially connected between a Vcc voltage terminal and second common data lines 80a and 80b. The gates of the NMOS transistors 47a and 47b are connected to the node 26, while the gates of the NMOS transistors 48a and 48b are connected to the output terminals 45a and 45b of the constant voltage application/current detect circuits 46a and 46b.

When the first block 10a is selected and the NMOS transistors 47a and 47b are conductive, voltages corresponding to the voltages output at the output terminals 45a and 45b are transmitted to the second common data lines 80a and 80b. When the NMOS transistors 47a and 47b are nonconductive, the voltages on the output terminals 45a and 45b do not affect the second common data lines 80a and 80b. The second common data lines 80a and 80b discharge currents to the Vss voltage terminal through circuits not shown.

For the second block 10b, a current-to-voltage converter circuit 50 is provided. This current-to-voltage converter circuit 50 comprises constant voltage application/current detect circuits 56a and 56b, switching NMOS transistors 57a and 57b, and voltage transmitting NMOS transistors 58a and 58b. The current-to-voltage converter circuit 50 converts the currents to voltages to detect the current values, and also functions as a constant voltage application circuit (constant voltage application means) which applies a constant voltage to the common data lines 52 and 54. The current-to-voltage converter circuit 50 is formed of wirings identical to those of the current-to-voltage converter circuit 40, and its functions are identical to those of the current-to-voltage converter circuit 40.

The second common data lines 80a and 80b are connected to separate sense amplifiers AMP1 and AMP2 (not shown), and the transmitted voltages are amplified to have the same amplitude as the logic signals in the integrated circuit.

FIG. 1 includes a row decoder 60. When a row address signal is input, decoder 60 selects one of the word lines 11a and 11b and applies a voltage Vcc to the selected word line.

FIG. 1 also has a column decoder 62. It receives the column address signal and a constant voltage from a reference voltage generator circuit 70, and outputs a constant voltage to unselected outputs and a voltage Vss to a selected output.

Further provided in FIG. 1 is a block decoder 64. This block decoder 64 receives an address signal for selecting one of the blocks in the memory matrix 10, and supplies the nodes 26 and 36 with a voltage Vcc when selected and a voltage Vss when selected.

Circuit 70 is a reference voltage generator circuit (a constant voltage generating means), which outputs a reference voltage at the output terminal 72. The absolute value of the reference voltage is about 1.2 V and its circuit is so designed that the value of the reference voltage does not fluctuate even when noises appear in the voltage Vcc. The wirings connected to the output terminal 72 are preferably shielded by other wiring conductors to prevent the effect due to the noises from the outside and due to potential fluctuation in other wirings in the integrated circuit. For example, in the case of polysilicon wirings, an aluminum layer and the substrate can be used for the shield. As shown, terminal 72 is coupled to circuits 46a, 46b, 56a, 56b, and decoder 64.

The reason that the reference voltage generator circuit 70 is used for the generation of the source line voltages from the column decoder 62 and the data line voltages from the constant voltage application/current detect circuits 46a, 46b, 56a and 56b is to prevent the constant voltages on the source lines and the data lines from becoming uneven due to variations in the transistor characteristics that may occur if constant voltage generating transistors are separately provided for the data lines and the source lines in the integrated circuit. By using the reference voltage generator circuit 70, all the source lines other than the selected source line, and all the data lines in the selected block are made to have the same voltage (Vcc). The source and the drain of all the unselected memory elements in the block thus will have the same voltage, and current flow through unselected data lines is thereby prevented.

In other words, with respect to the unselected memory elements, the drain voltage is at about 1.2 V (constant voltage) and is lower than the voltage Vcc (5 V), so with respect to the unselected memory elememts in which the voltage Vcc is applied to the control gate and in which no excessive electrons are injected in the floating gate, a voltage higher than the threshold voltage (about 3.2 V) of the MOS transistor which is a memory element, is applied to the control gate. If there is a potential difference between the source and the drain, a current, even though small, flows, and with respect to the unselected memory elements, a current flows from the source to the drain, or from the drain to the source. The magnitude of the current becomes non-negligible, and may prevent the data reading when the number of the columns is increased. Use of the reference voltage as in the embodiment to equalize the voltages on the unselected source lines and data lines eliminates this problem.

Figure 2:
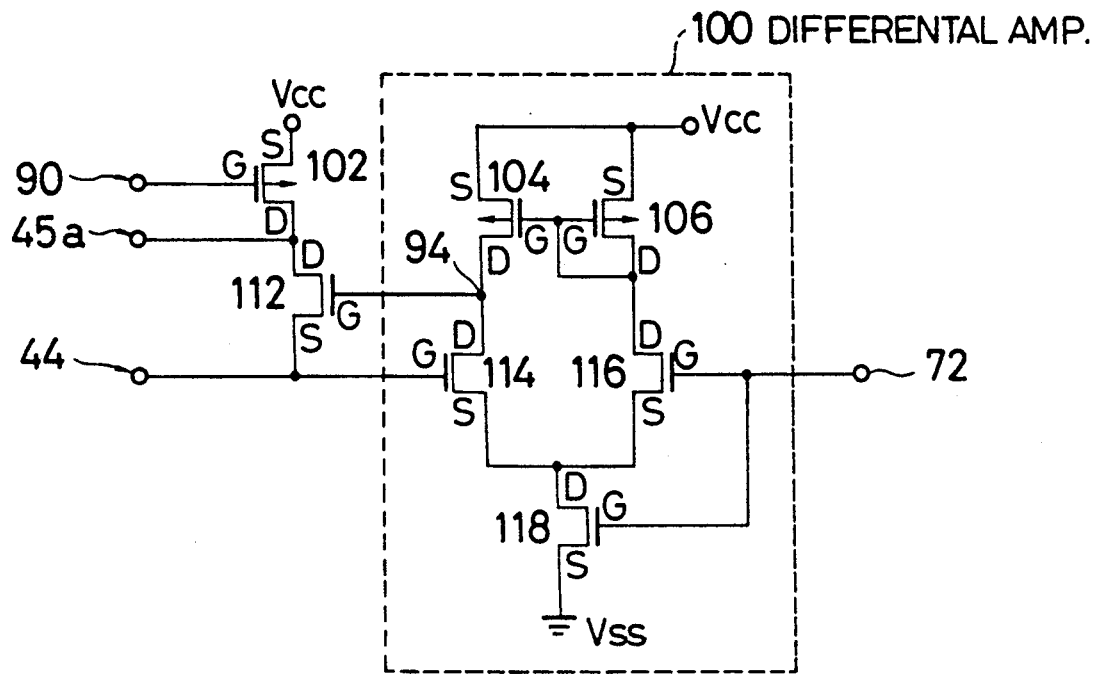
FIG. 2 is a circuit diagram of a constant voltage application/current detect circuit.

FIG. 2 is a circuit diagram showing an example of the constant voltage application/current detect circuit 46a. In the figure, 100 is a differential amplifier, which comprises PMOS transistors 104 and 106, and NMOS transistors 114, 116 and 118. The reference voltage input of the differential amplifier 100 is connected to the output terminal 72 of the reference voltage generator circuit 70, while the current input terminal of this differential amplifier 100 is connected to the common data line 44, and its inverted signal is applied to the node 94.

The source of a NMOS transistor 118 is set at the voltage Vss, and the gate is connected to the terminal 72 (output terminal of the reference voltage generator circuit 70), and the drain is connected to the sources of NMOS transistors 114 and 116. The NMOS transistor 116 has its gate connected to the output terminal 72, and its drain connected to the gate and drain of a PMOS transistor 106. A voltage Vcc is applied to the source of the PMOS transistor 106. A voltage Vcc is applied to the source of a PMOS transistor 104. The gate of the PMOS transistor 104 is connected to the gate of the PMOS transistor 106. The drain of the PMOS transistor 104 is connected to the drain of the NMOS transistor 114. The gate of the NMOS transistor 114 is connected to the common data line 44, and its drain is connected to the node 94.

Device 102 is a PMOS transistor for converting the current to a voltage, and a voltage Vcc is applied to its source. The drain of the PMOS transistor 102 is connected to the drain of a NMOS transistor 112 and the voltage output terminal 45a. The gate of the PMOS transistor 102 is connected to a terminal 90. Device 112 is a NMOS transistor, whose gate is connected to the node 94 of the differential amplifier 100, and whose source is connected to the common data line 44, and which controls the supply current value for the voltage stabilization of the common data line 44.

The operation of the circuit shown in FIG. 2 will now be described.

The differential amplifier 100 compares the voltage on the common data line 44 with the reference voltage on the terminal 72, and supplies the inversion of the signal on the common data line 44 via the node 94 to the gate of the NMOS transistor 112. The common data line 44 is thereby controlled to have the same value as the voltage on the output terminal 72. The common data line 44 has a current path only to the source line of the voltage Vss through the memory element, so the current supply need be made from the voltage Vcc only. The current flowing through the NMOS transistor 112 all passes the PMOS transistor 102. The resistance of the PMOS transistor 102 is determined depending on the configuration of the transistor and on the gate voltage given from the terminal 90. On the basis of this resistance and the current flowing through the NMOS transistor 112, the voltage difference between the voltage of the output terminal 45a and the voltage Vcc, i.e., the output amplitude is determined.

Figure 3:
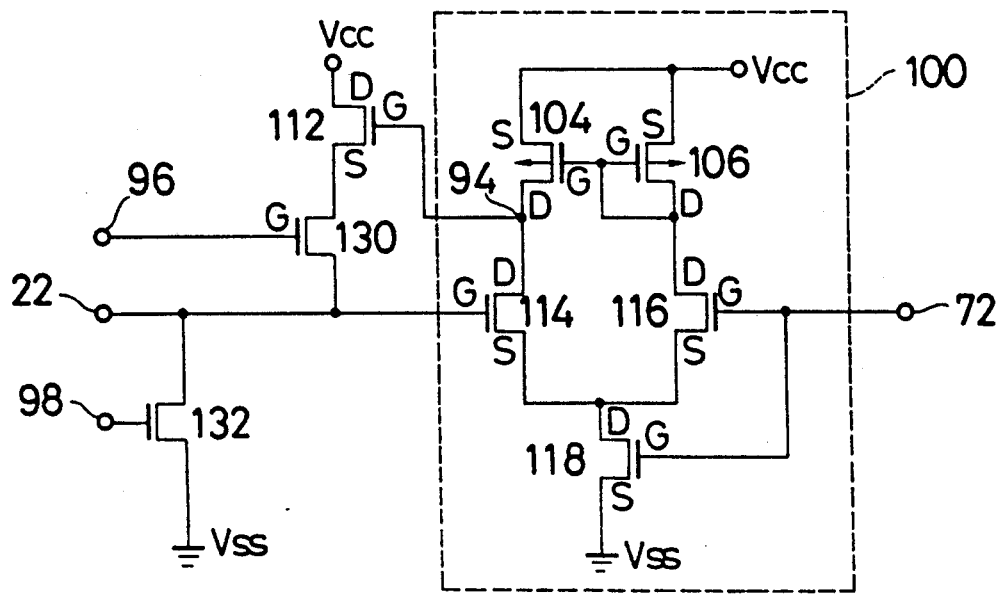
FIG. 3 is a circuit diagram showing signal output circuit part of the column decoder.

FIG. 3 is a circuit diagram showing a signal output circuit of the column decoder 62. This circuit comprises a differential circuit similar to the differential circuit 100 in the constant voltage application/current detect circuit shown in FIG. 2. Identical parts are given identical reference marks.

Circuit 100 is a differential amplifier, which receives a reference voltage at the terminal 72 and outputs a voltage at the terminal 22, and outputs its inversion at the node 94. The NMOS transistors 112 and 130 are connected in series between the Vcc voltage terminal and the output terminal 22, and the gate of the NMOS transistor 112 is connected to the node 94, and the gate of the NMOS transistor 130 is connected to a terminal 96. The NMOS transistor 132 has its drain connected to the output terminal 22, its source grounded (voltage Vss), and its gate connected to the terminal 98. Supplied to the terminals 96 and 98 are complementary signals consisting of the voltage Vcc and the voltage Vss from a logic part (not shown).

Operation of the column decoder 62 is explained with reference to FIG. 3.

The operation for outputting a constant voltage to the output terminal 22 is identical to that of the circuit of FIG. 2. By using a circuit similar to the circuit shown in FIG. 2, it is possible to remove unevenness of the voltages on the data lines and the source lines due to manufacturing variations in the MOS transistor characteristics. The differences from FIG. 2 are that the PMOS transistor 102 for the current detection is not provided, and that NMOS transistors 130 and 132 are provided. In this configuration, by means of the NMOS transistors 130 and 132, the output terminal 22 can assume two values of Vss and the constant voltage.

FIG. 4 is a voltage waveform diagram showing the operation of the circuit of FIG. 1. In the figure, the horizontal axis is the time axis, along which there are data read cycles A, B, C and D. X1 and X2 indicate signals output from the row decoder 60 to the word lines 11a and 11b. Y1, Y2, and Y3 to Y6 indicate signals output from the column decoder 62 to the wirings 22a and 22b, and 22c to 22f. Z1 and Z2 indicate signals output from the block decoder 64 to the nodes 26 and 36. S1, S2, S3, S4 and S5 indicate voltages on the source lines 12a, 12b, 14, 16b and 16g, and Setc indicates the voltage on other source lines.

W1, W2, W3 and W4 indicate outputs from the constant voltage application/current detect circuits 46a, 46b, 56a and 56b which are on the nodes 45a, 45b, 55a and 55b. U1 and U2 indicate voltages on the wirings 80a and 80b which are inputs to the sense amplifiers AMP1 and AMP2.

Data are read from the memory element M1a and M1l in the data read cycle A, from the memory element M1b and M1c in the data read cycle B, from the memory element M1m and M1x in the data read cycle C, and from the memory element M1n and M1o in the data read cycle D.

In the data read cycle A, by the functions of the row decoder 60, the row decoder output X1 is at the voltage Vcc, and the row decoder output X2 is at the voltage Vss, and the control gate voltage of the memory elements M1a to M1x are at the voltage Vcc. The column decoder 62 sets Y1 at the voltage Vss and sets other outputs at the constant voltage. The block decoder 64 sets Z1 at the voltage Vcc and Z2 at the voltage Vss thereby to select the first block. Then, the transistors 21a to 21g are turned on, and the transistors 31a to 31g are turned off. The signals Y1 to Y6 are transmitted to the source lines 12a to 12f and 14, and the source lines 12a and 14 will be at the voltage Vss while the source lines 12b to 12f will be at the constant voltage. The data lines 13a to 13f are also supplied with the constant voltage, but because the source voltage and the drain voltage of the conducting memory elements other than the memory elements M1a, and M1l, i.e., M1b to M1k are at the constant voltage, no current flows through the source-drain circuit. The currents flowing through the memory elements M1a and M1l are supplied through the data lines 13a and 13f to the common data lines 42 and 44. To maintain the data lines at the constant voltage, currents are supplied from the constant voltage application/current detect circuits 46a and 46b. The currents are converted into voltages and fed to the output terminals 45a and 45b. The MOS transistors 47a and 47b are given a voltage Vcc at their gates to be on, so currents corresponding to the voltages to which they are converted are output through 48a and 48b to the second common data lines 80a and 80b, and the voltages on the second common data lines 80a and 80b are varied.

The output Z2 of the block decoder 64, is at the voltage Vss, so the NMOS transistors 57a and 57b are off, and the voltages on the output terminals 55a and 55b of the constant voltage application/current detect circuits 56a and 56b do not affect the outputs on the common data lines 80a and 80b.

Because the NMOS transistors 31a to 31g are off, although the source lines 16b to 16g of the unselected block 10b do not have means for controlling the voltages, they are at the voltage of not lower than Vss and not higher than the constant voltage. Accordingly, a current flows through one of the data lines 17a to 17f, and even where currents flow from 56a and 56b through the common data lines 52 and 54, since the NMOS transistors 57a and 57b are off, the voltages on the second common data lines 80a and 80b are not affected.

When the data read cycle B is entered, the column decoder 62 sets its output Y1 at the constant voltage, and its output at the voltage Vss. The source lines 12a (waveform S1) and 14 (waveforms S3) are at the constant voltage, and the source line 12b (waveform S2) is at the voltage vss. The sources and the drains of the memory elements M1b and M1c are at the same voltage and no current flows between them. The memory elements M1b and M1c cause currents respectively corresponding to the written data to flow from the data lines 13a and 13b to the source line 12b, and in the same way as discussed in connection with the data read cycle A, the currents flowing through the memory elements M1a and M1l are converted into voltages and output to the second common data lines 80a and 80b.

In the data read cycle C, as compared with the cycle B, the output Y1 of the column decoder 62 is changed to the voltage Vss, the output Y2 is changed to the constant voltage, the output Z1 is changed to the voltage Vss, and the output Z2 is changed to the voltage Vcc. Accordingly, the source lines 14 and 16g will be at the voltage Vss, and the source lines 16b to 16g will be at the constant voltage. Since the source line 14 is at the boundary between the blocks of the memory matrix, it is selected accordingly to the output of the block decoder 64 whichever of the blocks is selected. Voltages corresponding to the data written in M1m and M1x are fed to the second common data lines 80a and 80b.

In the data read cycle D, compared with the cycle C, the output Y1 is changed to the constant voltage, and the output Y2 is changed to the voltage Vss, and the source lines 14 and 16g become at the constant voltage and the source line 16b becomes at the voltage Vss. Voltages corresponding to the currents flowing through the memory elements M1n and M1o are fed to the second common data lines 80a and 80b.

Variations in the voltages on the data lines in the operation described are as set forth below.

For instance, let us consider the transition made from the cycle A to B. In the cycle A, there is no path for current flow to the data line 13b, so it is at the same voltage as the common data line 44. In the cycle B, the current flowing through the memory element M1c must be transmitted through the data line 13b, and the resistor 24b to the common data line 44. In order to cause a current to flow through a resistor, there must be a potential difference across the resistor, i.e., the data line and the common data line, and this potential difference is determined on the current value flowing through the resistor. When the voltage on the data line 13b is below the constant voltage, since the source line 12c is set at the constant voltage, a current flows from the source line 12c through the memory element M1d to the data line 13b. The resistance of the resistor 24 must therefore be sufficiently smaller than the source-drain resistance of M1d in the on state but the memory element usually has a high resistance, so a resistance of up to several kΩ is accepted.

The data lines have parasitic capacitances which cannot be neglected in the case of high-speed reading of written data. If the charge stored in the parasitic capacitances is discharged through the memory elements, the voltage on the data line is lowered, but because the current driving power of the memory element is small, increasing the voltage amplitude of the data line prevents a high-speed data reading of the integrated circuit.

From the points discussed above, the resistors 24a to 24f and the resistances of the resistors 34a to 34f should preferably be as small as possible, and when the common data lines and the data lines are connected by films of metal, such as aluminum, the highest speed is achieved. From the viewpoint of avoiding erroneous data output of the integrated circuit due to noises, it is necessary to reduce the fluctuation of the current output of the constant voltage application current detect circuit 46a due to the voltage variation on the common data line 44. Where the voltage vibration between the voltage Vss and the semiconductor substrate forming the the integrated circuit is transmitted through the parasitic coupling capacitances on the substrate and the data lines, to the common data lines, the higher the resistance of the resistors 24a to 24f, and 34a to 34f, the smaller is the noise vibration of the common data line 44. The presence or absence of the resistance of the resistors 24a to 24f and 34a to 34f can be determined, by the designer of the circuit, taking account of the particular application of the integrated circuit.

Comparison of the speed of the data reading according to the invention with the conventional X-cell or NOR-type memories having data selecting MOS transistors, with respect to the voltage amplitude required by the data lines and the time constant representing the transition time, is set forth below:

It is assumed that 16 data lines are coupled to the common data line without interposed resistors. In the prior art, source-drain resistance of the data line selecting MOS transistor is assumed to be 1 KΩ. The capacitance of each data line is assumed to be 5 pF. The voltage amplitude due to the presence and absence of the cell current in the constant voltage application/current detect circuit can be determined solely from the combination of the transistors in the circuit, but is assumed to be about 0.6 mV. The current amplitude of the memory element is assumed to be 60 μA. Then the equivalent output resistance is 10 Ω.

From the conditions set forth above, in the conventional system, the amplitude of the data line is 60 mV and the time constant is about 5 nanoseconds. In contrast, according to the invention, the amplitude of the data line is 0.6 mV, and the time constant is 16×5 pF33 10 Ω32 0.8 nanoseconds, and it will be seen that a high-speed data reading is possible.

In the above, the invention has been described with particular reference to EPROM integrated circuits, but the invention is not limited to it, but can be applied to all integrated circuits which selectively drive rows and columns to select the memory elements.

As has been described, according to the invention, in a memory matrix having means for selectively driving rows and colummns, a plurality of data lines are electrically coupled and a plurality of data lines are always supplied with a constant voltage, the means for applying the constant voltage is provided with means for detecting the current required to maintain the constant voltage to form a circuit for selecting the circuit for driving the memory matrix and a circuit for selecting the memory element in the memory matrix. The data line selecting gates and the data line voltage maintaining MOS transistors for the respective data lines required in the prior art can be eliminated, the configuration can be simplified, and the area for the integrated circuit can be reduced. Moreover, it is possible to increase the data reading speed without using the data line voltage maintaining MOS transistors and directly connecting the data lines and the constant voltage application means.

What is claimed is:

1. A MOS semiconductor memory device comprising:
    a memory matrix having semiconductor memory elements arranged in rows and columns;
    a plurality of word lines connected to the semiconductor memory elements located in corresponding rows;
    a row decoder coupled to said word lines for outputting a row selection signal to a selected one of the rows of the semiconductor memory elements through the word lines;
    a plurality of source lines connected to the semiconductor memory elements located in corresponding columns;
    a column decoder coupled to said source lines for outputting a column selection signal to a selected one of the columns of the semiconductor memory elements through said source lines;
    a plurality of data lines connected to the semiconductor memory elements arranged in corresponding columns;
    a converter circuit coupled to said data lines, the converter circuit having an output, the converter circuit being configured to couple a constant voltage to said data lines and configured to detect the current required for maintaining the data lines at the constant voltage, the converter circuit applying a signal to said output indicative of the detected current.

2. A MOS semiconductor memory device according to claim 1, wherein the data lines have respective electrical resistors connected in series with the data lines.

3. A MOS semiconductor memory device according to claim 2, wherein each said electrical resistor is formed of a resistive material.

4. A MOS semiconductor memory device according to claim 2, wherein said electrical resistor is formed of a MOS transistor with its gate potential being fixed.

5. The MOS semiconductor memory device according to claim 1, further comprising a reference voltage generator circuit providing a reference voltage and being coupled to said converter and to said column decoder, wherein said column decoder generates said column selection signal on the basis of said reference voltage, and said converter generates said voltage applied to the data lines on the basis of said reference voltage.

6. The MOS semiconductor memory device according to claim 1, wherein said memory matrix comprises a plurality of blocks, and said MOS semiconductor memory device further comprises:
    a plurality of switch means respectively connected in series with the source lines; and
    a block decoder for selecting one of the blocks, said block decoder controlling the operation of the switch means to turn on all the switch means connected to the source lines belonging to the selected block and to turn off the switch means connected to the source lines belonging to the unselected block;
wherein said column decoder outputs the column selection signal to one of the columns of the semiconductor memory elements, through a plurality of wiring conductors, said switch means and said source lines.

7. A MOS semiconductor memory device according to claim 6, wherein said switch means comprises a MOS transistor, a first electrode of said MOS transistor is connected to the wiring conductor, a second electrode of this MOS transistor is connected to the source line, and the gate of the MOS transistor is connected to an output terminal of the block decoder.

8. The memory device of claim 1 wherein said converter circuit comprises a constant voltage application circuit having a first terminal coupled to said data lines, said voltage application circuit being configured to couple said constant voltage to said first terminal,
    said converter circuit further comprising a current detector circuit coupled to said converter output and said first terminal.

9. The device of claim 8 wherein said voltage application circuit comprises a differential amplifier having said first terminal and a second terminal, the second terminal being coupled to receive a reference voltage.

10. The device of claim 9 further comprising a reference voltage generator circuit coupled to said second terminal of said differential amplifier.

11. The device of claim 9 wherein said differential amplifier includes an internal node controllingly coupled to said current detector circuit.

12. A MOS semiconductor memory device comprising:
   three or more memory cells, each memory cell having a first and second electrodes and a gate electrode, the gate electrodes of said memory cells being coupled to commonly receive a first potential;
   a decoder coupled to apply a second potential to said first electrode of a selected one of said memory cells, said decoder being coupled to apply a first intermediate potential between said first and second potentials to said first electrode of the unselected memory cell separated from said selected memory cell by at least on other memory cell; and
   said second electrodes of said selected and unselected memory cells being commonly applied a second intermediate potential between said first and second potentials.

13. An MOS semiconductor memory device according to claim 12 further having a voltage applying means for commonly applying said second intermediate potential to said second electrodes of said memory cells through a common node.

14. A MOS semiconductor memory device according to claim 13 further having a detecting means for detecting the potential variation of the common node according to the stored data in the memory cell, wherein said detecting means controls said voltage applying means so as to reduce the potential variation.

15. A MOS semiconductor memory device according to claim 14 wherein said detecting means is part of said voltage applying means.

16. The memory device of claim 12 wherein said decoder includes a differential amplifier circuit (100) having a first terminal (22) and a second terminal (72), said amplifier being configured to couple a constant voltage to said first terminal and configured to detect the current required for maintaining said first terminal (22) at the constant voltage.

17. The memory device of claim 12 wherein said first intermediate potential is substantially equal to said second intermediate potential.

18. A MOS semiconductor memory device comprising:
   three or more memory cells, each of said memory cells having first and second electrodes and a gate electrode, the gate electrodes of said memory cells commonly receiving a first potential;
   a decoder applying a second potential to said first electrode of a selected one of said memory cells, said decoder applying a first intermediate potential between said first and second potentials to said first electrode of the unselected memory cell separated from said selected memory cell by at least one other memory cell;
   said second electrodes of said selected and unselected memory cells being commonly applied a second intermediate potential between said first and second potentials;
   a voltage applying means for commonly applying said second intermediate potential to said second electrodes of said memory cells through a common node; and
   a detecting means for detecting the potential variation of the common node according to the stored data in the memory cell, wherein said detecting means controls said voltage applying means so as to reduce the potential variation.

19. A MOS semiconductor memory device according to claim 18 wherein said detecting means if part of said voltage applying means.

20. The memory device of claim 18 wherein said first intermediate potential is substantially equal to said second intermediate potential.

21. The memory device of claim 1 further comprising a common data line coupling said data lines to said converter circuit.

* * * * *